April 19, 1966 W. A. ENDE 3,246,386

ELECTRICAL CONNECTED COMPONENT AND METHOD

Filed Jan. 26, 1962

INVENTOR.
WOLFGANG A. ENDE
BY Clarence R. Patty Jr.
ATTORNEY

United States Patent Office 3,246,386
Patented Apr. 19, 1966

3,246,386

ELECTRICAL CONNECTED COMPONENT AND METHOD

Wolfgang A. Ende, Bradford, Pa., assignor to Corning Glass Works, Corning, N.Y., a corporation of New York Filed Jan. 26, 1962, Ser. No. 168,992
13 Claims. (Cl. 29—155.5)

This invention relates to electrical connections and more particularly to connecting resistors and the like to printed circuits but is in no way limited to such applications.

It is a specific object of this invention to provide an improved method for economic attachment of electrical components to printed circuit boards.

Another object of this invention is to provide a method for making electrical connections to uncoated and uncapped electrical components.

A still further object is to provide a method for electrically connecting resistors whereby failures resulting from resistor caps are eliminated.

Still another object is to provide a method for connecting resistors to printed circuits where the space required is maintained at a minimum.

Another object is to provide a method for connecting electrical components where the lead effects on component performance are eliminated and the termination effects are reduced.

Additional objects, features and advantages of the present invention will become apparent, to those skilled in the art, from the following detailed description and the attached drawing, on which, by way of example, only the preferred embodiments of this invention are illustrated.

I have found that the objects of this invention can be achieved by providing a susbtantially non-conductive circuit board having a tapered hole formed therein at a desired location, metallizing the walls of said hole, positioning in said hole an uncoated, uncapped and suitably terminated electrical component, and thereafter affixing said electrical component to said circuit board by conventional methods such as solder dipping.

In connecting, for example, resistors comprising an electroconductive coating on a non-conductive substrate, it has heretofore been necessary to provide terminal leads from such coating, which leads were attached by end capping, embedding in a conductive paste or cement applied to the end, and the like, which terminal lead connections have been a source of failure of the resistors. In addition, since components have heretofore been connected by means of flexible terminal leads, they had to be coated or otherwise insulated to prevent inadvertent contact with other components or leads.

In accordance with the method of this invention an electrical component, such as for example, a resistor, capacitor, inductor, impedance element, transistor, thermistor, varistor or the like, may be connected to a printed circuit board, economically, reliably, and in a space-saving manner.

Figure 1:
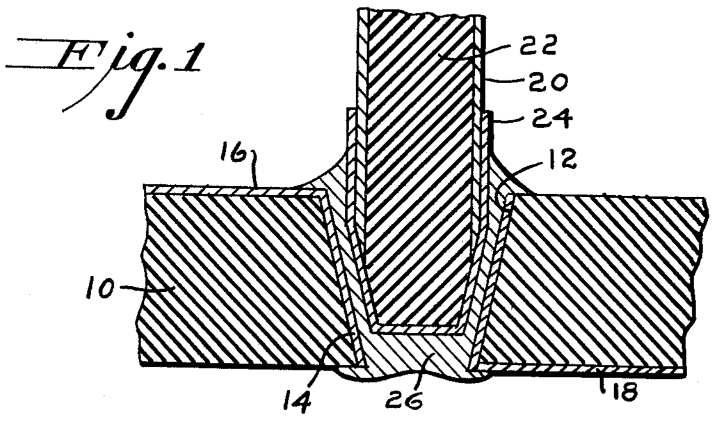
FIG. 1 is a cross sectional view of a resistor connected to a printed circuit.

Referring to FIG. 1, a printed circuit board 10, consisting of a substantially non-conductive material such as glass, ceramics, plastics and the like, is suitably prepared by forming therein a hole 12, said hole having a taper, metallizing the surface surrounding said hole by forming thereon a layer 14, of a conductive material, such as copper, silver, or the like and forming on the surface or surfaces of said circuit board 10, the desired conductive pattern illustrated by conductive strips 16 and 18.

It should be noted that said layer 14 and the said conductive pattern may be composed of the same material and applied simultaneously.

A resistor comprising an electroconductive coating 20, formed on a non-conductive substrate 22, is terminated by applying a layer 24, of a conductive material, such as for example silver, over the end portion of said resistor. The connection of the resistor to the circuit board is then accomplished by placing the terminated end of said resistor in said tapered hole and affixing it to the circuit board by conventional methods such as solder dipping or the like. The resistor may also be affixed by means of a conductive bonding medium such as conducting cement. As the solder or cement solidifies into a mass 26 about the resistor and within and around the hole, a good electrical and mechanical connection is effected.

The tapered hole 12, is preferably formed with the opening at one end larger and at the other end smaller than the size of the electrical component to be attached. To facilitate insertion of a component into said hole the component may be formed with a tapered end.

Forming the conductive pattern, metallizing the tapered surface surrounding said hole, as well as applying the conductive layer 24, may be accomplished by any of various commercial methods such as fuming, evaporating, plating, brushing and the like.

Figure 2:
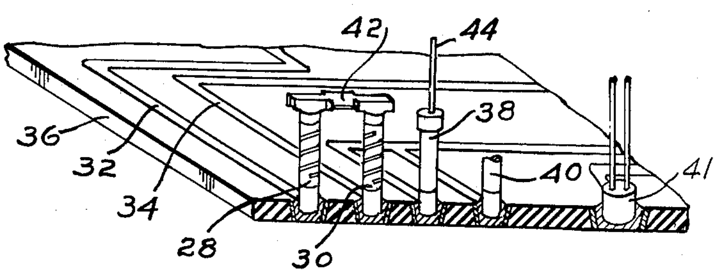
FIG. 2 is an oblique view illustrating the connection of various electrical components within a printed circuit.

FIG. 2 illustrates various electrical components connected to a circuit board within a typical printed circuit in accordance with the method of this invention. Resistors 28 and 30 are connected to printed circuit conductive strips 32, and 34, respectively, and circuit board 36, in accordance with the method hereinabove described. Inductor 38, capacitor 40 and transistor 41 are similarly connected. The other ends of the electrical components may be connected in various ways depending on the particular application. For example, they may be joined together as illustrated by clip 42, which connects resistors 28 and 30. The end may also be terminated with a lead 44, and connected to any other point in the conventional manner.

Figure 3:
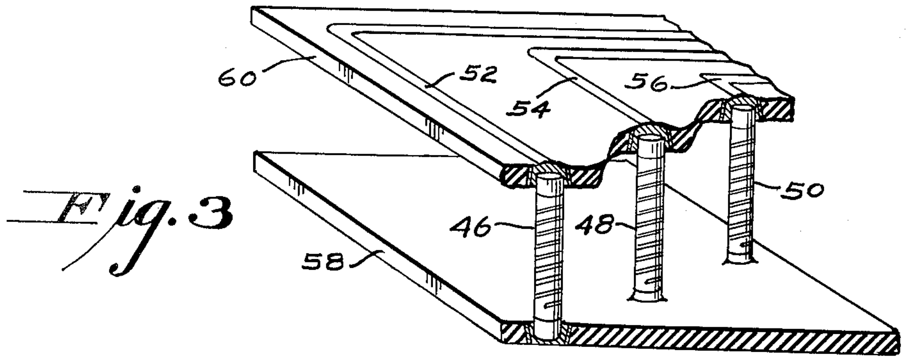
FIG. 3 is an oblique view illustrating the connection of resistors to two printed circuit boards.

The method of the instant invention, however, is particularly suitable for making connections to both ends of electrical components where two circuit boards are employed as shown in FIG. 3. Resistors 46, 48, and 50 are connected to printed circuit conductive strips 52, 54 and 56, respectively, and to printed circuit boards 58 and 60 in the manner described heretofore. When desired, a circuit may be printed on one or both sides of each of the circuit boards.

I have found that in connecting electrical components in accordance with the method of this invention, high quality mechanical and electrical connections can be made at lower cost and with the resulting product having greater reliability than has been possible with heretofore known methods.

Although the present invention has been described with respect to specific details of certain embodiments thereof, it is not intended that such details be limitations upon the scope of the invention except insofar as set forth in the following claims.

What is claimed is:

1. A method of connecting an electrical component to a printed circuit formed on a circuit board, comprising the steps of providing an electrical component having at least one leadless connecting end, forming a tapered hole through said circuit board with the opening at one end larger and at the other end smaller than the size of said leadless connecting end, metallizing the walls of said hole, applying a coating of conducting material over the leadless connecting end of said electrical component, inserting the coated connecting end into said tapered hole through the larger end thereof, flowing a conductive bonding medium into said hole about said coated connecting end, and thereafter allowing said conductive bonding medium to solidify.

2. A method of connecting an electrical component to a printed circuit formed on a circuit board, comprising the steps of providing an electrical component having at least one leadless connecting end, forming a tapered hole through said circuit board with the opening at one end larger and at the other end smaller than the size of said leadless connecting end, metallizing the walls of said hole, applying a coating of conducting material over said leadless connecting end of said electrical component, inserting the coated connecting end into said tapered hole through the larger end thereof, flowing molten solder into said hole about said coated connecting end, and thereafter allowing said solder to solidify.

3. The method of claim 2 where said electrical component is a resistor.

4. The method of claim 2 where said electrical component is a capacitor.

5. The method of claim 2 where said electrical component is an inductor.

6. The method of claim 2 where said electrical component is an impedance element.

7. The method of claim 2 where said electrical component is a transistor.

8. The method of claim 3 where said conducting material is silver.

9. A method of connecting an electrical component to a printed circuit formed on a circuit board, comprising the steps of providing an electrical component having at least one leadless connecting end, forming a tapered hole through said circuit board with the opening at one end larger and at the other end smaller than the size of said leadless connecting end, metallizing the walls of said hole, applying a coating of conducting material over said leadless connecting end of said electrical component, inserting the coated connecting end into said tapered hole through the larger end thereof, flowing a conducting cement into said hole about said coated connecting end, and thereafter allowing said cement to solidify.

10. In the method of electrically connecting an electrical component to a circuit formed on a substantially non-conductive board, the improvement comprising providing an electrical component having at least one leadless connecting end, forming a tapered hole through said board with the opening at one end larger and at the other end smaller than the size of said leadless connecting end, adhering a film of metallic material to the walls of said hole, applying a coating of conducting material over said leadless connecting end of said electrical component, inserting the coated connecting end into said tapered hole through the larger end thereof, and flowing a conductive bonding medium into said hole about said coated connecting end.

11. A method of connecting an electrical component to a printed circuit formed on a circuit board comprising the steps of providing an electrical component having at least one tapered leadless connecting end, forming a tapered hole through said circuit board having a taper corresponding to that of said tapered connecting end, metallizing the walls of said hole, applying a coating of conductive material over said tapered leadless connecting end of said electrical component, inserting the coated connecting end into said tapered hole through the larger end thereof, flowing molten solder into said hole about said coated connecting end, and thereafter solidifying said solder.

12. A method of connecting a two terminal electrical component to a printed circuit system comprising the steps of providing a leadless electrical component having two connecting ends, forming a tapered hole through a first circuit board, forming a tapered hole through a second circuit board, each of said tapered holes having an opening at one end larger and at the other end smaller than the size of said leadless connecting ends, metallizing the walls of each of said holes, applying a coating of conducting material over each of the leadless connecting ends of said electrical component, inserting one of the coated connecting ends into the tapered hole in said first circuit board through the larger end thereof, inserting the other of the coated connecting ends into the tapered hole in said second circuit board through the larger end thereof, flowing a conductive bonding medium into each of said tapered holes about each of said coated connecting ends, and thereafter solidifying said conductive bonding medium.

13. The method of claim 12 wherein the leadless connecting ends of said electrical component are tapered with the tapers corresponding to those of the holes in said first and second circuit boards.

References Cited by the Examiner

UNITED STATES PATENTS

| | | | |
|---|---|---|---|
| 2,599,710 | 6/1952 | Hathaway | 29—155.5 |
| 2,651,833 | 9/1953 | Kernahan | 29—155.5 |
| 2,830,918 | 4/1958 | Zimmerman. | |
| 2,897,409 | 7/1959 | Gitto. | |
| 2,898,520 | 8/1959 | Sterner | 317—101 |
| 2,903,627 | 9/1959 | McGarvey | 317—101 |
| 2,912,746 | 11/1959 | Oshry et al. | 29—155.5 |
| 3,034,198 | 5/1962 | Rayburn et al. | 29—155.5 X |
| 3,034,930 | 5/1962 | Foudriat. | |
| 3,076,230 | 2/1963 | Parker et al. | 29—155.5 X |
| 3,151,278 | 9/1964 | Elorde | 29—155.5 X |

WHITMORE A. WILTZ, *Primary Examiner.*

JOHN T. BURNS, JOHN F. CAMPBELL, *Examiners.*